United States Patent

[11] 3,590,340

[72] Inventors Masaharu Kubo
Kokubunji-shi;
Hiroto Kawagoe, Kodaira-shi; Teruo Furuya, Kodaira-shi; Yoshikazu Hatsukano, Kodaira-shi, all of, Japan

[21] Appl No. 707,858
[22] Filed Feb. 23, 1968
[45] Patented June 29, 1971
[73] Assignee Hitachi, Ltd.
Tokyo, Japan
[32] Priority Feb. 27, 1967
[33] Japan
[31] 42/12087

[54] BREAKDOWN PREVENTING CIRCUIT AND AN INTEGRATED DEVICE THEREOF FOR A SEMICONDUCTOR DEVICE HAVING AN INSULATE GATE ELECTRODE
22 Claims, 10 Drawing Figs.

[52] U.S. Cl. .......... 317/235 R, 317/235 B, 307/304
[51] Int. Cl. .......... H01l 19/00, H01c 7/14
[50] Field of Search .......... 317/235/22.2, 235/21.1; 307/205, 202, 237, 251, 279, 303, 304; 330/38

[56] References Cited
UNITED STATES PATENTS
3,390,314 6/1968 Medwin .......... 317/235

*Primary Examiner*—Jerry D. Craig
*Attorney*—Craig, Antonelli, Stewart & Hill

ABSTRACT: A circuit and an integration thereof for preventing the breakdown of an oxide film in an MOS type field effect transistor, wherein a resistor is connected between a metal gate electrode and a protecting diode (clamp diode).

INVENTORS

MASAHARU KUBO, HIROTO KAWAGOE
TERUO FURUYA, YOSHIKAZU HATSUKANO

BY Craig & Antonelli

ATTORNEYS

FIG. 6
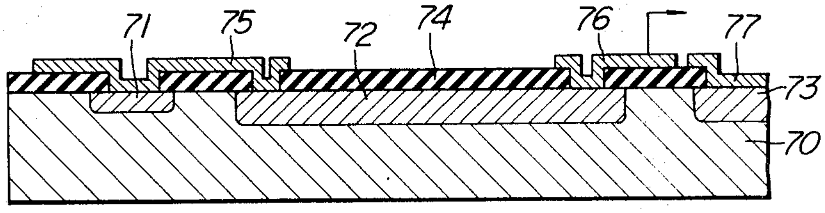
FIG. 7
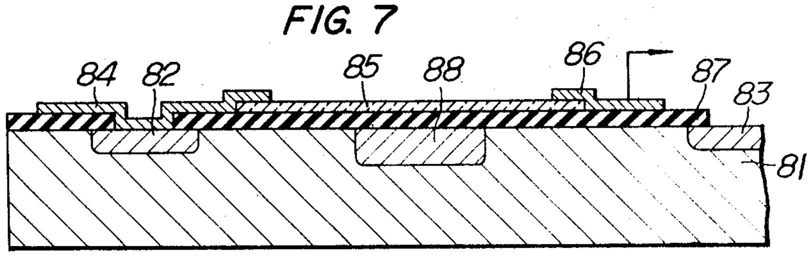
FIG. 8
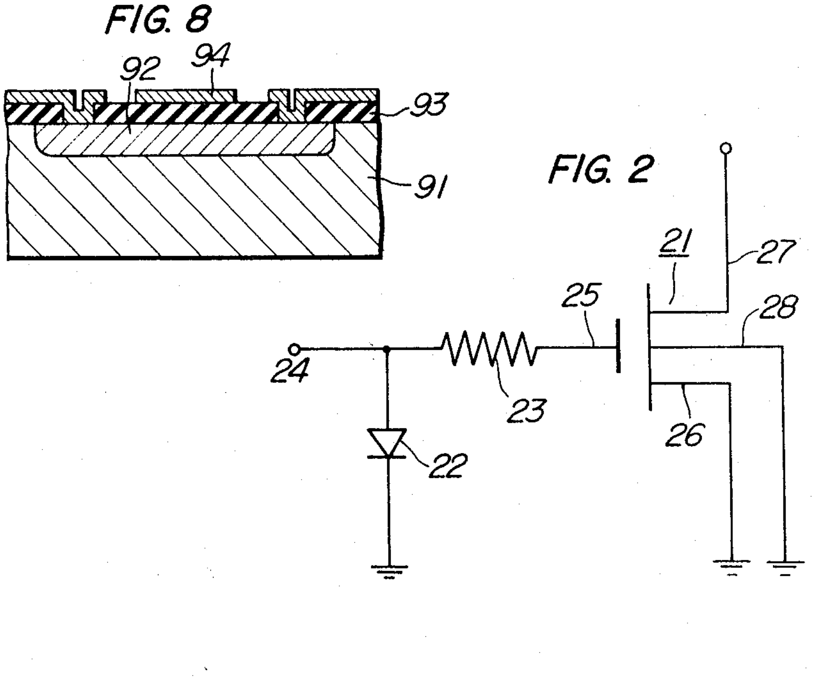
FIG. 8, FIG. 2
INVENTORS
MASAHARU KUBO, HIROTO KAWAGOE
TERUO FURUYA, YOSHIKAZU
HATSUKANO
BY Craig & Antonelli
ATTORNEYS

INVENTORS
MASAHIRO KUBO, HIROTO KAWAGOE,
TERUO FURUYA, YOSHIKAZU
HATSUKANO

BY Craig & Antonelli
ATTORNEYS

BREAKDOWN PREVENTING CIRCUIT AND AN INTEGRATED DEVICE THEREOF FOR A SEMICONDUCTOR DEVICE HAVING AN INSULATE GATE ELECTRODE

This invention relates to a circuit for preventing the breakdown of an insulator in a semiconductor device having an insulated gate electrode such as the so-called Metal-Insulator-Semiconductor (hereinafter referred to as MIS) type field effect transistor, and to a semiconductor device integrating the above circuit in a semiconductor substrate.

In a well-known MIS-type semiconductor device such as a Metal-Oxide-Semiconductor-type field effect transistor (hereinafter referred to as MOSFET) it is known that in the manufacturing process, in operation, or during the loading of a printed board, a thin insulating film under a gate electrode easily breaks down by an external spurious noise having an extremely high peak value (or amplitude). For example, an $SiO_2$ film having a thickness of about 1000 A. breaks down by application of a voltage of about 100 volts. And in order to prevent the breakdown of the $SiO_2$ film, it has been the practice to connect a rectifying element such as a protecting diode, or a clamp diode, between the metal gate electrode and the semiconductor substrate.

However, since the function of the protecting diode is not sufficient due to some reasons described hereinbelow, the accidental breakdown of the insulator has frequently occurred making the manufacture and usage of an MIS-type semiconductor device both inconvenient and disadvantageous.

One object of this invention is to provide a novel breakdown preventing circuit for an MIS-type semiconductor device.

Another object of this invention is to provide a semiconductor device integrating this breakdown preventing circuit in a single semiconductor substrate.

Examinations by the inventors of a prior art breakdown preventing circuit have shown that the insufficient function of the prior art circuit is due to the improper relation between the time constant of the circuit portion at the protecting diode and that of the circuit portion at the insulator under the metal electrode of the MIS-type semiconductor device connected in parallel with the diode.

According to this invention, a novel breakdown preventing circuit is provided, in which the time constant of the circuit portion at the insulator under the metal electrode of an MIS-type semiconductor device is suitably selected such that the breakdown of the protecting diode always precedes that of the insulator, thereby preventing the breakdown from occuring. It is desirable that the time constant of the circuit at the insulator is selected larger than that of the circuit across the protecting diode.

This invention will be more apparent with reference to the accompanying drawings in which;

FIGS. 1*a* and 1*b* are cross-sectional views of an example of a prior art breakdown preventing circuit device for a MOSFET and an equivalent circuit diagram thereof respectively.

FIG. 2 is a breakdown preventing circuit diagram for a MOSFET in one embodiment of this invention.

FIG. 3*a* is a cross-sectional view of a breakdown preventing circuit device in one embodiment of this invention taken along line III*a*–III*a* of the device shown in FIG. 3*b*.

FIG. 3*b* is a top view of the device shown in FIG. 3*a*.

FIGS. 6, 7 and 8 are partial cross-sectional views of circuit devices in other embodiments of this invention, respectively.

Figure 1A:
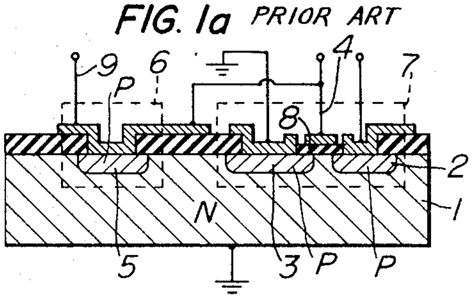
FIG. 1a PRIOR ART
Figure 1B:
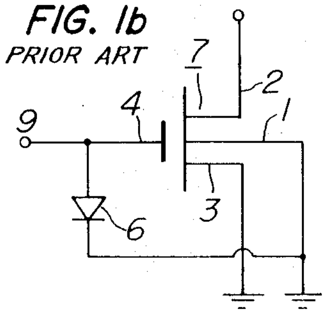
FIG. 1b PRIOR ART

In order to understand this invention easily explanations will be made first of a prior art device. FIG. 1*a* shows a well-known breakdown preventing circuit device for a gate insulating film of an MOSFET and FIG. 1*b* shows an equivalent circuit thereof. Like reference numerals are used to denote like parts in FIGS. 1*a* and 1*b*. As shown in these figures, a diode 6 is connected between a gate electrode 4 and an N-type silicon substrate 1 of the MOSFET 7. The gate insulator 8 (consisting of $SiO_2$) of this circuit device often breaks down. It is considered that a surge voltage, which is caused, for example, by an electric charge accumulated on the human body of an operator handling the device or by an AC supply voltage induced through a soldering iron during the mounting of the device on a printed board, makes the electric potential of the gate electrode 4 as high as the breakdown voltage of the gate insulator 8 before the electric potential of the diode 6 reaches its reverse breakdown voltage. This will be made apparent by referring to FIG. 5, in which the abscissa is time and the ordinate is the value of the applied voltage. We will consider now that at $t=t_1$, a voltage, increasing stepwise in the negative direction as shown by 51*a* exceeding the breakdown voltages $VB_i$ of the insulator and $V_{Bi}$ of the protective diode, is applied through an input terminal 9 to the gate 4 and the anode of the diode 6. Then, the voltage applied at the PN junction of the diode 6 increases exponentially as shown by the curve 54*a* with a given time constant $\tau_d$, while the voltage applied at the insulator 8 increases exponentially as shown by the curve 52*a* with a time constant $\tau_1$ smaller than $\tau_d$. Before $t_2$ when the voltage (54*a*) at the PN junction reaches the breakdown voltage $-V_{Bd}$, i.e. at $t=t_4$, the voltage (52*a*) of gate insulator reaches its breakdown voltage $-V_{Bi}$. The gate insulator 8, therefore, breaks down, the protecting function of the diode being useless.

Figure 5:
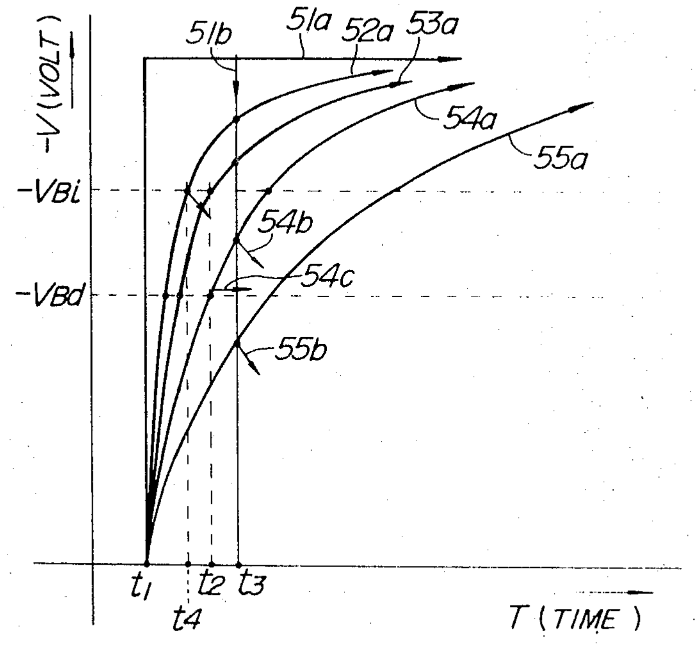
FIG. 5 is a diagram for explaining the operational function of the semiconductor device including a breakdown preventing circuit according to this invention.

This invention solves such a problem in a prior art device. An embodiment is shown in FIG. 2. A resistor 23 (100 Ω—10 kΩ) is connected to a gate electrode 25 of an MOSFET which comprises a gate electrode 25, a source electrode 26, a drain electrode 27 and a substrate electrode 28. The resistor 23 is also connected to the anode of a (semiconductor crystal) diode 22 and an input terminal 24. A common reference potential is given to the cathode of diode 22, the source electrode 26 and the substrate electrode 28 of the FET 21. The value of the resistance of the resistor 23 is selected such that the time constant $\tau$ of the gate input circuit of the MOSFET 21 which is connected in parallel with the both terminals of diode 22 is in a prescribed relation with the time constant $\tau_d$ of the diode 22 which is substantially determined by the equivalent capacitance of the P-N junction and the equivalent resistance of the cathode path in the semiconductor substrate. In FIG. 5, the voltage at the PN junction of the diode 22 increases as shown by the curve 54*a* with a time constant $\tau_d$ and reaches the breakdown voltage $-V_{Bd}$ at $t=t_2$, where the diode 22 breaks down. Therefore, it is seen that the time constant $\tau$ of the input circuit should be selected such that the voltage applied at the gate insulator of the MOSFET 21 does not exceed its breakdown voltage $-V_{Bi}$ until $t=t_2$. In other words, the time constant $\tau$ should be larger than $\tau_2$ of a transient response curve 53*a* showing $V=-V_{Bi}$ at $t=t_2$. According to this invention, the time constant $\tau$ of the gate input circuit can be arbitrarily given by selecting the value of resistor 23 connected in series with the gate electrode forming a capacitor. By setting $\tau>\tau_2$ by a suitable selection of the value of resistor 23 the breakdown of the diode 22 precedes that of the gate insulator and prevents the gate insulator from breakdown. From the disclosure of the principle of this invention as described above it is readily thought of by those skilled in the art that the connection of a resistor to other positions than the gage and/or the connection of a capacitor thereto will yield a relation $\tau>\tau_2$. In order to accomplish the object of this invention, a resistor may be connected between the source electrode 26 and the common reference potential. However, in this case care should be taken, that negative feedback will result. Furthermore, the connection of a resistor to the gate input circuit and/or the connection of a capacitor often transform the waveform of a normal input pulse signal. Therefore the position of the connection and the values of the resistor and the capacitor should be carefully chosen.

Figure 3A:
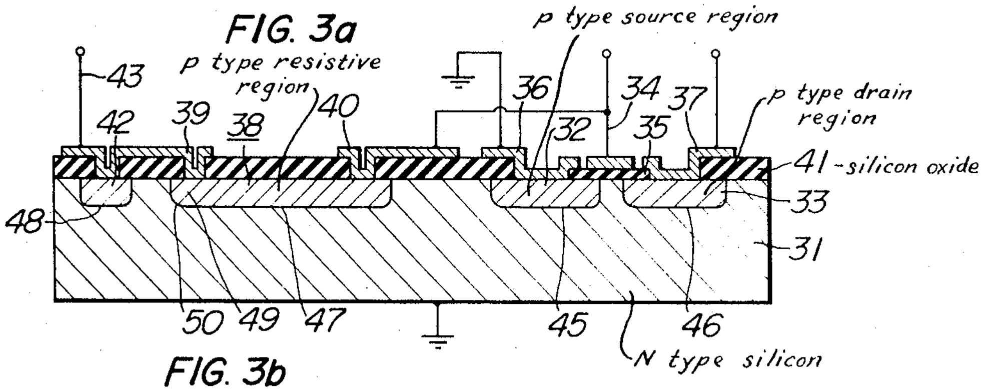

Hereinafter explanations will be made of another embodiment of this invention with reference to FIGS. 3*a* and 3*b*. An MOS semiconductor device shown in these figures comprises an N-type semiconductor substrate 31, for example, a semiconductor silicon having a resistivity of about 1 Ωcm.; a P-type source region 32, a P-type drain region 33, a P-type resistive region 38 and a P-type diode region 42 formed simultaneously by diffusing selectively an impurity such as boron in the surface of said substrate; a silicon oxide film 41 of about 5000 to 6000 A. thickness formed on the surface of substrate; conducting layers 36, 37, 39 and 40, for example, of aluminum fitted to the regions 32, 33, 38 and 42 through perforations formed in given portions of the insulating film 41; a relatively thin silicon oxide film (gate insulator) 35 of about 1000 to 1500 A. thickness formed between the source and drain regions 32 and 38 on the substrate; and a gate electrode 34, for example, of aluminum formed on the gate insulator. The terminals 39 and 40 fitted to two different positions of the resistive region 38 are connected to the input electrode 43 provided on the diode region 42 and the gate 34, respectively. FIG. 3*a* shows cross-sectional view taken along $III_a$–$III_a$ of FIG. 3*a*, in which the right half portion shows b P-channel enhancement mode MOSFET. When there is no signal at the gate electrode 34, the channel between the source region 32 and the drain region 33 is not conductive, while when a signal having a negative voltage with respect to the source 36 (and the substrate 31) is applied to the gate electrode 34 the channel becomes conductive. The breakdown voltage of the PN junction 48 of the diode 42 which is biased reversely with respect to the signal voltage is selected considerably lower than that of the gate insulator 35 which ranges within about 100 and several 10's volts, for example, 60 to 70 volts. All the P-type diffused regions 32, 33, 38, and 42 have an impurity concentration of $10^{19}$ atoms/cm$^3$ and a depth of about 4 $\mu$. The resistive region 38 has a width to length ratio of about 1 : 10 and has a resistance of about 2 kΩ. It has been found by the inventors through various experiments that the resistance of this resistive region is preferably from 100 Ω to 10 kΩ.

A breakdown preventing circuit device for an MIS semiconductor device as described above corresponds not in a strict sense but a model sense to a circuit shown in FIG. 2. In order to examine the operation of the device shown in FIGS. 3*a* and 3*b* during the transient period of a signal application, a more equivalent circuit shown in FIG. 4 is convenient. When the substrate 31 is connected with the source region 32, the equivalent capacitance 68 and resistance 69 between the gate 34 and the source electrode 36 may be expressed by a simple RC series circuit as shown in FIG. 4. The resistive region 38 forms a PN junction 47 with the substrate 31 and is electrically isolated therefrom. In an AC sense, however, the resistive region is coupled capacitively with the substrate 31 so that it is equivalently expressed by a resistance 65 existing between the terminals 39 and 40 and a capacitance 66 distributed between this resistive region 38 and the substrate 31. The resistances 64 and 67 are the resistances of current paths through substrate 31. The diode region 42 may be expressed by an ideal rectifying element 62 and a junction capacitance 63 connected in parallel therewith. The element 61 is an input signal source.

The operation of the breakdown preventing circuit device is basically the same as explained in FIG. 2, as is readily seen from the circuit composition of FIG. 4. The time constant of the protective diode determined by the capacitance 63 and the resistance 64 and the time constant of the gate input circuit of the MOSFET determined by the capacitance 68 and the resistances 65 and 69 can explain the function of preventing the gate insulator from breaking down.

According to a measurement performed by the inventors, the capacitance 68 formed between the gate electrode 34 and the source region 32 exhibits about 4 pF and the resistance 65 formed in the resistive region 38 amounts to about 2 kΩ, and therefore the time constant of the gate input circuit of the MOSFET becomes about 8 nano-sec. On the other hand, the capacitance 63 of the PN junction 48 is about 2 pF and the resistance 64 existing in the substrate 31 under the diode region 42 is about 500 Ω, and therefore the time constant of the diode circuit becomes about 1 nano-sec. As described above, since in the MOSFET of the present embodiment the time constant of the gate input circuit is designed so as to become greater than that of the diode circuit, the breakdown of the gate insulator can be prevented almost completely.

When a rectangular wave having a relatively narrow width as shown by 51*b* in FIG. 5 is supplied from the signal source 61, the waveform is transformed by the action of a low pass RC filter formed by the distributed capacitance 66 and the resistance 65. The voltage applied at the gate insulator of the MOSFET increases first along the curve 55*a* in FIG. 5. At $t=t_3$ it begins to decrease in response to the input waveform. It is therefore considered that the low pass filter acts to prevent the gate insulator from breaking down.

Figure 3B:
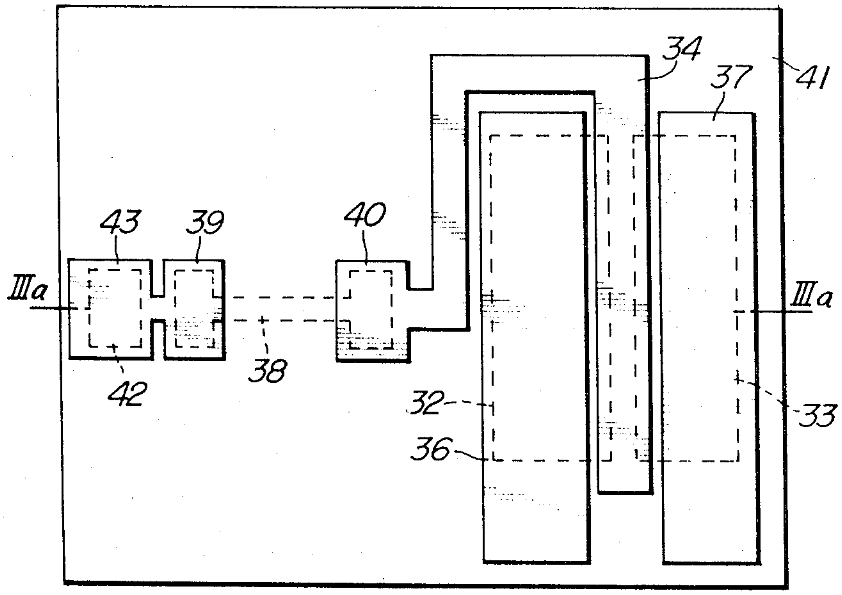
Figure 4:
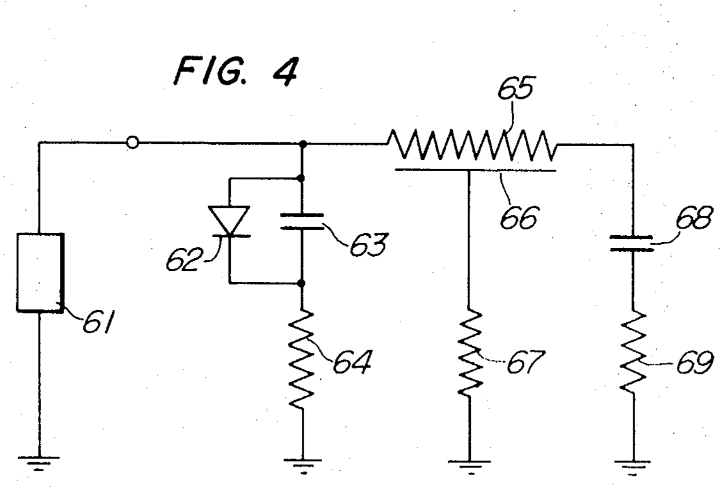
FIG. 4 is an equivalent electric circuit diagram of the semiconductor device shown in FIGS. 3*a* and 3*b*.

In the embodiment of this invention shown in FIGS. 3*a* and 3*b* the time constant $\tau(\tau>\tau_2)$ is determined substantially by the resistance 65 and the MOS capacitance 68.

Furthermore, although in the embodiment shown in FIGS. 3*a* and 3*b* the diode region 42 and the resistive region 38 are formed in separate surfaces of the semiconductor substrate, it is readily thought of by those skilled in the related art by perfectly understanding the operating principle of the present invention that these regions may be integrated. Explaining this with reference to FIGS. 3*a* and 3*b*, one end portion 49 of the resistive region may be utilized as the diode region, without forming them in separate surfaces of the semiconductor substrate. In other words, one end portion 50 formed between the resistive region 38 and the substrate 31 may be utilized as the PN junction of the clamp diode. Therefore, in such a modified embodiment the input terminal 43 becomes directly connected with terminal 39 and thus there exists a merit that the area of the semiconductor material necessary for the construction of a circuit may be reduced.

In order to determine a necessary value of $\tau$ with reference to FIGS. 4 and 5 it is possible for those skilled in the art to control in the substrate 31 the values of the capacitance and the resistance of the circuit as shown in FIG. 4 by using a well-known manufacturing method of a passive element.

FIG. 6 shows a modification of this invention. A P-type diode region 71 is formed on an N-type silicon substrate 70 to be more shallow than a resistive region 72, e.g. about 2 $\mu$ thick, thereby obtaining a relatively low breakdown voltage (50 to 60 volts).

As apparent from FIG. 5, $V_{Bd}$ B*d* is lower than $V_{Bi}$ , the operation of the protecting diode has a greater margin. Further, since the diode breaks down in a shorter time after the application of an spurious input signal, the selection of $\tau$ within the MOSFET can be made in a wide range, which is advantageous in the circuit design. In FIG. 6 the breakdown voltage of the PN junction formed by the diode region 71 depends on the depth of this diffusion layer or the maximum curvature. (In the present embodiment the depth and the radius of the curvature are assumed nearly equal.) Accordingly as the depth is small, or the curvature is large, the breakdown voltage becomes lower. In FIG. 6, 73 is a drain region, 77 a drain electrode and 76 a conducting interconnection layer along an $SiO_2$ film from one end of the resistive layer 72 to the gate electrode (not shown). The layer 75 is a conducting layer interconnecting a diode region 71 and the other end of the resistive layer 72. An input signal is applied at the layer 75.

FIG. 7 shows another embodiment of this invention. A diode region 82 and a drain region 83 are provided in the surface of the silicon substrate 81. An elongated layer 85 of resistive material such as aluminum or nichrome is formed by evaporation on the silicon oxide film 87 covering the surface of substrate 81.

FIG. 8 shows a case where a conducting layer 94 for another interconnection is disposed on an insulating film 93 on a resistive region 92 formed in the substrate 91. With use of this method it is possible to integrate many components in a small semiconductor wafer.

Although above explanations have been made only of some embodiments according to this invention, any modification if necessary may be made by those skilled in the art.

For example, although the insulating film used here is mainly of silicon oxide, it is needless to say that this film may be of silicon nitride.

Often a parasitic field effect transistor is formed by an input signal on the surface of the substrate under the conducting interconnection layer or under the layer of resistive material shown in FIG. 7. When the function of the protecting diode is thereby damaged, a highly doped $N^+$region 88 having the same conductivity-type as that of substrate may be formed by diffusing an N-type impurity such as phosphorus and antimony to prevent the formation of the above-mentioned parasitic transistor.

Further, although in the above embodiments explanations have been made of the protection of a P-channel enhancement mode MOSFET, this invention may be applied to the protection of a semiconductor device having various MIS structures if the protecting diode is biased preliminarily or two PN junctions are formed to response both positive and negative signals interchangeably.

What we claim is:

1. A breakdown preventing circuit for a semiconductor device having an insulated gage electrode comprising the combination of:
   - a semiconductor device comprising a semiconductor substrate, said substrate having at least one semiconductor region of a resistivity different from said substrate, an insulating film covering at least one portion of the surface of said substrate and a gate electrode formed on said insulating film;
   - a rectifying element connected between said substrate and said gate electrode, said rectifying element having a reverse breakdown voltage smaller than the breakdown voltage of said insulating film under said gate electrode; and
   - a time constant controlling means connected in a closed circuit formed by said device and said element for providing, in the circuit path across said insulating film below said gate electrode to said at least one region within said substrate, a time constant larger than that of a transient response curve which reaches the breakdown voltage of the insulating film below said gate electrode at the moment when the voltage applied at said rectifying element reaches its breakdown voltage.

2. The circuit according to claim 1, wherein said time constant controlling means provides, in the circuit path across said insulating film below said electrode, a time constant larger than that of the circuit path across said rectifying element.

3. A protecting circuit device for a semiconductor device having an insulated gate electrode comprising the combination of:
   - a semiconductor substrate of a first conductivity type;
   - an insulating film covering at least one portion of the surface of said substrate;
   - a gate electrode formed on said insulating film;
   - a semiconductor region of a second conductivity type formed in the surface of said substrate, the reverse breakdown voltage of a PN junction formed between said region and said substrate being lower than the breakdown voltage of said insulating film;
   - a resistive means connected between said region and said gate electrode and having a resistance value sufficient to provide, in the circuit path across said insulating film below said gate electrode, a time constant larger than that of a transient response curve which reaches the breakdown voltage of the insulating film below said gate electrode at the moment when the voltage applied across said PN junction reaches the reverse breakdown voltage of the PN junction; and
   - a conducting means for receiving an input signal connected to said region of said second conductivity type.

4. The device according to claim 3, wherein said resistive means has a resistance value sufficient to provide, in the circuit path across said insulating film below said gate electrode, a time constant larger than that of the circuit path across said PN junction.

5. A breakdown preventing circuit device for a semiconductor device having an insulated gate electrode comprising:
   - a semiconductor substrate of a first conductivity type; an insulating film formed over at least a portion of the surface of said substrate; a gate electrode formed on said film; a resistive region of a second conductivity type opposite to said first conductivity type formed in one portion of the surface of said substrate; contacts connected ohmically to at least two different portions of said resistive region; means for connecting one of said contacts to said gate electrode; and an input means connected to the other one of said contacts for supplying an input signal voltage thereto;
   - the reverse breakdown voltage of a PN junction formed between said substrate and said region of said second conductivity type being lower than the breakdown voltage of the insulating film under said gate electrode.

6. An insulated gate type field effect transistor having a protective circuit device which comprises:
   - a semiconductor substrate of a first conductivity type having a main surface;
   - a source and a drain region of a second conductivity type formed in the main surface of said substrate;
   - an insulating film formed on the surface of said substrate between said source and drain regions;
   - a gate electrode provided on said insulating film;
   - a source and a drain electrode connected to said source and drain regions, respectively;
   - a semiconductor region of the second conductivity type formed in the surface of said substrate and spaced from said source and drain regions, a PN junction being formed between said substrate and said semiconductor region;
   - an input signal supplying means connected to said semiconductive region; and
   - a resistive means connected between said semiconductive region and said gate electrode and having a resistance value sufficient to provide, in the circuit path across said insulating film below said gate electrode, a time constant larger than that of a transient response curve which reaches the breakdown voltage of the insulating film below said gate electrode at the moment when the voltage applied across said PN junction reaches the reverse breakdown voltage of the PN junction.

7. An insulated gate type field effect transistor according to claim 6, wherein said substrate consists essentially of an N-type silicon, said insulating film consist of a silicon compound, and the resistance value of said resistive means is selected within the range of 100 Ω to 10 kΩ.

8. An insulated gate type field effect transistor having a protective circuit device which comprises:
   - a semiconductor substrate of a first conductivity type having a main surface;
   - a first, a second and a third semiconductor region of a second conductivity type opposite to the first conductivity type formed separately in the main surface of said substrate;
   - an insulating film covering the main surface of said substrate between said first and second regions;
   - a gate electrode formed on said insulating film;
   - a source and a drain electrode provided on the surface of said first and second regions, respectively;
   - a first and a second electrode means provided separately on the surface of said third region, the region between said first and second electrode means operating as a resistor, the reverse breakdown voltage of at least a portion near the second electrode means and of the PN junction formed between the semiconductor substrate and the third region being lower than the breakdown voltage of the insulating film below said gate electrode;

a conductive means connecting said gate electrode with said first electrode means; and an input signal supplying means connected to said second electrode means.

9. An insulating gate type field effect transistor according to claim 7, wherein said substrate consists essentially of an N-type silicon, all said regions are P-type diffused silicon regions, and said insulating film consists essentially of a silicon compound.

10. An insulating gate type field effect transistor according to claim 9, wherein the resistance value of said third region between said first and second electrode means is selected within the range of 100 Ω to 10 kΩ.

11. A breakdown preventing circuit for a semiconductor device having an insulated electrode, comprising:

a semiconductor substrate in said semiconductor device, said substrate having at least one semiconductor region of a resistivity different from said substrate, an insulating film covering at least one portion of a surface of said substrate, said electrode being disposed on said insulating film; and breakdown preventing means connected with the circuit path from said electrode across said film to said at least one region within said substrate including rectifying means having a reverse breakdown voltage smaller than the breakdown voltage of said insulating film under said electrode, and means operatively connected with said rectifying means and with said insulated electrode for providing a relative time delay in a signal applied through said circuit path across said film to assure that the breakdown voltage caused by a signal applied to both the rectifying means and the insulated electrode occurs earlier in the rectifying means than across said insulating film.

12. A breakdown preventing circuit according to claim 11, characterized in that said time delay providing means includes a resistive component connected to said electrode.

13. A breakdown preventing circuit according to claim 12, characterized in that said resistive component is formed in said substrate.

14. An integrated circuit which includes a substrate, a region within said substrate having a resistivity different from said substrate, an insulating film over a portion of said substrate, an electrode on at least a portion of said insulating film, rectifying means formed in said substrate, characterized by circuit means for connecting the circuit path formed between said electrode and said region within said substrate across said insulating film in parallel with the circuit path formed by said rectifying means and for providing such relative time delay in said circuit path across said insulating film so as to assure earlier voltage breakdown in said rectifying means than across said insulating film.

15. An integrated circuit according to claim 14, characterized in that said circuit means is formed in effect within said substrate.

16. An integrated circuit according to claim 15, characterized in that said circuit means is constituted by a diffused impurity region in said substrate having a predetermined resistance.

17. An integrated circuit according to claim 16, characterized in that said rectifying means is constituted by a PN junction formed in said substrate.

18. An integrated circuit according to claim 14, characterized in that said circuit means is constituted by a diffused impurity region in said substrate having a predetermined resistance.

19. A breakdown preventing circuit for a semiconductor device having an insulated gate electrode comprising the combination of:

a semiconductor device comprising a semiconductor substrate, at least one region within said substrate having a resistivity different from said substrate, an insulating film covering at least one portion of the surface of said substrate and a gate electrode formed on said insulating film;

a rectifying element connected between said substrate and said gate electrode, said rectifying element having a reverse breakdown voltage smaller than the breakdown voltage of said insulating film under said gate electrode; and a time constant controlling means consisting substantially of a resistor connected between said rectifying element and said gate electrode, the resistance value of said resistor being selected such that the time constant determined by the resistance value of said resistor and the capacitance between said at least one region within said substrate and said gate electrode is larger than that of the circuit path across said rectifying element.

20. A protecting circuit device for a semiconductor device having an isolated gate electrode comprising the combination of:

a semiconductor substrate of a first conductivity type;

an insulating film covering at least one portion of the surface of said substrate;

a gate electrode formed on said insulating film;

a first semiconductor region of a second conductivity type formed in the surface of said substrate, the reverse breakdown voltage of a PN junction formed between said region and said substrate being lower than the breakdown voltage of said insulating film;

a resistive means including an elongated, second semiconductor region of the second conductivity type formed in one portion of said substrate surface and a pair of terminals connected ohmically to each end portion of said region, the pair of terminals being connected to said first semiconductor region and said gate electrode, respectively; and a conducting means for receiving an input signal operatingly connected to said first semiconductor region of the second conductivity type.

21. A protecting circuit device for a semiconductor device having an isolated gate electrode comprising the combination of:

a semiconductor substrate of a first conductivity type;

an insulating film covering at least one portion of the surface of said substrate;

a gate electrode formed on said insulating film;

a first semiconductor region of a second conductivity type formed in the surface of said substrate, the reverse breakdown voltage of a PN junction formed between said region and said substrate being lower than the breakdown voltage of said insulating film;

a resistive means including an insulating film formed on the surface of said substrate, a resistive material deposited on said film, both end portions of said resistive material, being connected to said first semiconductor region and said gate electrode, respectively; and a conducting means for receiving an input signal operatingly connected to said region of the second conductivity type.

22. A semiconductor device comprising:

a semiconductor substrate of a first conductivity type having at least one semiconductor region of a resistivity different from said substrate;

a field effect semiconductor component including an insulating film formed on a surface of said substrate, a conductive layer formed on the insulating film;

a protecting layer component including a region contacting said substrate of said first conductivity type to form a rectifying barrier having a breakdown voltage lower than the breakdown voltage of said insulating film between said conductive layer and said semiconductor region within said substrate;

an electrode means ohmically connected to said substrate;

a first, conducting means for electrically connecting said region of said protecting component with said conductive layer of said field effect semiconductor component;

a second, conducting means for connecting said electrode means with a common reference potential;

an input terminal to which an input is applied;

a third, conducting means for connecting said input terminal with said region of said protecting component; and fourth means operatively connected with said field effect semiconductor component and said protective component for increasing the relative time constant of the equivalent circuit appearing between said region of said protecting component and said common reference potential and crossing said insulating film below said conductive layer of said field effect semiconductor component to a value larger than that of the equivalent circuit appearing between said region of said protecting component and the common reference potential and crossing said rectifying barrier.